United States Patent [19]

Kosaka et al.

[11] Patent Number: 5,073,815
[45] Date of Patent: Dec. 17, 1991

[54] SEMICONDUCTOR SUBSTRATE AND METHOD FOR PRODUCING THE SAME

[75] Inventors: Daisuke Kosaka, Takarazuka; Junichi Konishi, Ikeda, both of Japan

[73] Assignee: Ricoh Company, Ltd., Tokyo, Japan

[21] Appl. No.: 570,426

[22] Filed: Aug. 21, 1990

[30] Foreign Application Priority Data

Aug. 30, 1989 [JP] Japan .................................. 1-224788

[51] Int. Cl.5 ..................... H01L 29/36; H01L 23/54; H01L 21/22
[52] U.S. Cl. ....................... 357/67; 357/55; 357/71
[58] Field of Search .................. 357/46, 48, 49, 50, 357/55, 71, 60, 75, 2, 59, 67, 63, 64

[56] References Cited

U.S. PATENT DOCUMENTS

| | | | |
|---|---|---|---|
| 4,292,730 | 10/1981 | Ports | 357/49 |
| 4,472,729 | 9/1984 | Shibata et al. | 357/49 |
| 4,717,681 | 1/9188 | Curran | 357/67 |
| 4,819,037 | 4/1989 | Sakakibara et al. | 357/49 |
| 4,939,568 | 7/1990 | Kato et al. | 357/49 |

Primary Examiner—Rolf Hille
Assistant Examiner—S. V. Clark
Attorney, Agent, or Firm—Cooper & Dunham

[57] ABSTRACT

A semiconductor substrate that comprises: a base plate member made from a dielectric material; a refractory metal film covering at least a part of the base plate member; a single crystal semiconductor film formed on the refractory metal film; and an impurities-diffusion layer formed in said single crystal semiconductor film in a side contacting with the refractory metla film. The diffusion layer has a density grade gradually decreasing toward a direction away from the refractory metal film so that this impurities-diffusion layer comes in ohmic contact with the refractory metal film.

7 Claims, 9 Drawing Sheets

SEMICONDUCTOR SUBSTRATE AND METHOD FOR PRODUCING THE SAME

BACKGROUND OF THE INVENTION

1. Field of the Invention

The present invention relates to a semiconductor substrate and a method for producing the substrate which is constituted as an SOI (Silicon On Insulator) structure or the similar structure and which substrate is used in various semiconductor integrated circuit devices.

The producing method of the present invention especially relates to one which is called a recrystallization method.

The semiconductor substrate of the present invention is applicable to and can be used in various devices such as a high integrated LSI device, a high pressure resisting device and a three-dimensional integrated circuit.

The SOI structure includes the structure in which the semiconductor single crystal film to be grown is made from a compound semiconductor such as GaAs other than silicon. That is, the present invention is not limited to the structure in which the semiconductor single crystal film is made from silicon.

2. Description of the Related Art

An SOI structure has been proposed in which a semiconductor film is grown on a dielectric film or substrate.

The SOI structure is fabricated by various techniques such as a recrystallization method, an epitaxial growing method, an insulation layer burying method and a lamination method. Such techniques are explained in general in "Techniques for forming SOI structure" (published from Sangyo Tosho Co. Ltd., 1987).

Among the recrystallization methods, in accordance with a laser beam recrystallization method, the crystal is grown in such a way that a polycrystalline film or an amorphous film is formed on an insulation film base then the film is molten by energy of a laser beam and after that the molten film is recrystallized while the location of the molten portion is being changed.

In the above mentioned laser beam recrystallization method, various attempts have been tried in order to obtain a single crystal film by improving the temperature distribution in the polycrystalline or amorphous film as exemplified below.

(a) A method in which an optical system or a plurality of laser beam sources are used so as to even the temperature distribution in the laser beam spot.

(b) A method in which an optical absorbent film or an antireflection film is disposed on a surface of a sample in order to change the absorbent ratio of the laser beam incident upon the sample so as to even the temperature distribution over the sample.

(c) A method in which the structure of the sample is changed so that the heat radiation ratio of the sample is spatially changed so as to even the temperature distribution over the sample.

However, even though the above mentioned methods are adopted, it becomes only possible to partially grow the single crystal in the sample and it is still difficult to grow the single crystal over the entire area of the sample.

Also, Japanese Patent Publication (KOKOKU) No. 62-40858 discloses a semiconductor device. However, the disclosed device has a large junction capacitance which impedes the functional speed of the device.

SUMMARY OF THE INVENTION

It is therefore an object of the present invention to provide a semiconductor substrate which is suitably used in various semiconductor devices and makes it possible to upgrade the quality of the semiconductor device.

Also, it is another object of the present invention to provide a method for producing the semiconductor substrate in which a single crystal film can be formed over an entire large area of the substrate with a simple process.

The above mentioned object of the present invention can be achieved by a semiconductor substrate comprising a base member on which a single crystal semiconductor film is formed and a refractory metal film interposed at least a part of between the base member and the single crystal film wherein the single crystal film comes in ohmic contact with the refractory metal film through an impurities-diffusion layer which has a gradual easy grade of density along the depth of the layer.

The base member is made from, for example, dielectric material such as $SiO_2$ or $Si_3N_4$.

The single crystal semiconductor film is made from, for example, Si, GaAs or GaP.

The refractory metal film is made from, for example, W, Ti, Mo or Pt. The refractory metal film may also be made from a refractory alloy such as silicide of those refractory metals.

The second object of the present invention mentioned before can be achieved by a method for producing the semiconductor substrate, the method comprising steps of: depositing an amorphous or polycrystalline semiconductor film on a base member through a refractory metal film; arranging a cooling medium on the semiconductor film; irradiating an energy beam upon the semiconductor film to melt the film; growing crystal in the film while changing the molten portion of the film; doping impurities in the single crystallized semiconductor film; and forming a semiconductor film on the single crystallized semiconductor film by an epitaxial growth process.

The energy beam irradiating the semiconductor film is, for example, an optical beam such as a laser beam, an electron beam or a heat wave.

The cooling medium is preferably composed of a liquid organic compound having a relatively high evaporation temperature. Examples of such an organic compound are surfactants such as polyethylene glycol, polyethylene ether, polyethylene ester and polypropylene oxide.

The refractory metal film can be used as a conductor in the semiconductor device to which the substrate is applied.

When the energy beam is irradiated upon the amorphous or polycrystalline film formed on the base member, a large crystal easily grows due to the function of the cooling medium. Besides, the energy is reflected by the refractory metal film, which prevents the heat from affecting the base member.

Advantages of the semiconductor substrate of the present invention are that it becomes possible to utilize the refractory metal film disposed under the single crystal semiconductor film as a conductor of the semiconductor device and that it becomes possible to connect the semiconductor single crystal film and the refractory metal film together through an ohmic contact therebetween.

An advantage of the method for producing the semiconductor substrate in accordance with the present invention is that, due to the function of the cooling medium, it becomes possible to form a single crystal film over a large area by a recrystallization method, which enables to realize a three-dimensional integrated circuit device.

Further objects and advantages of the present invention will be apparent from the following description of the preferred embodiments of the invention as illustrated in the accompanying drawings.

DESCRIPTION OF THE PREFERRED EMBODIMENTS

Figure 1:
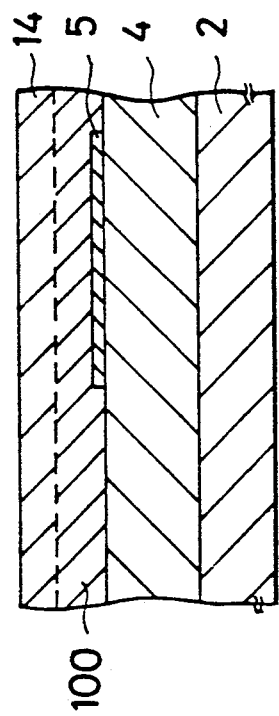
FIG. 1 is a sectional view of a semiconductor substrate in accordance with an embodiment of the present invention.

FIG. 1 illustrates an embodiment of the present invention.

On a single crystal silicon substrate 2 is formed a silicon oxide ($SiO_2$) film 4 of about 1 μm thick. On the film 4 is formed a tungsten film 5 of about 800 Å thick as a refractory metal film. The tungsten film 5 is patterned. On the film 5 is formed a single crystal silicon film 14 of about 1000 Å thick. The film 14 has a lower layer 100 which is in contact with the film 5 and which layer 100 includes impurities such as phosphorus. The grade of the density of the impurities is such that the density gradually decreases upward along the depth of the film.

Figure 2:
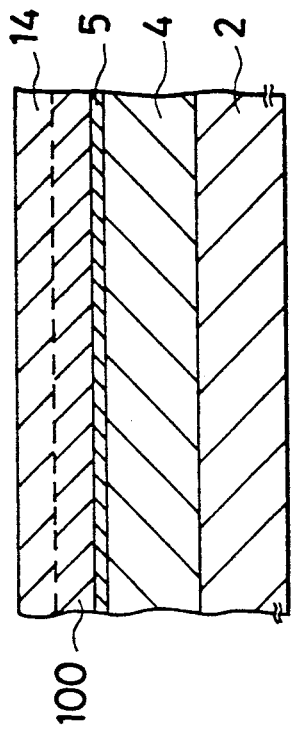
FIG. 2 is a sectional view of a semiconductor substrate in accordance with another embodiment of the present invention.

FIG. 2 illustrates another embodiment of the present invention in which the tungsten film 5 is disposed over the entire area of the silicon oxide film 4 and the single crystal silicon film 14 is formed on the tungsten film 5. The lower layer 100 of the film 14 has an impurities density grade gradually decreasing upward along the depth of the film, as the embodiment of FIG. 1.

Figure 4:
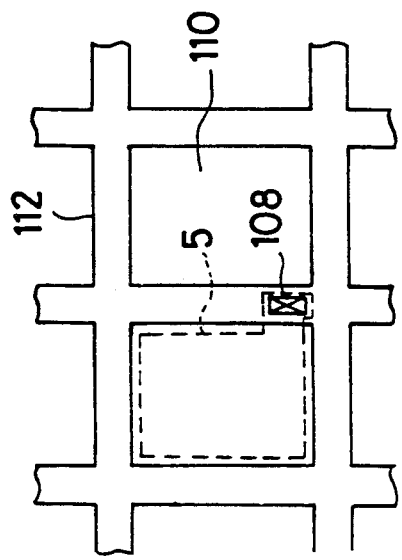
FIG. 4 is a plan view of the state of device isolation of FIG. 3.
Figure 3:
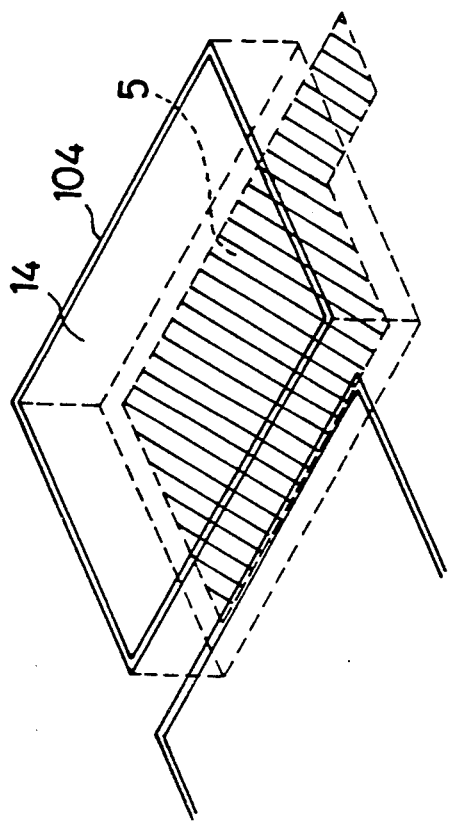
FIG. 3 is a perspective view of a state of device isolation in which the semiconductor substrate of FIG. 1 is used.

FIGS. 3 and 4 illustrate a perspective view and a plan view of a state of device isolation using the substrate of FIG. 1, respectively.

Numeral 104 designates an electric insulation film which surrounds a region 110 for forming a device element. Under the region 110 is disposed a tungsten film 5. The device elements are separated by element isolating regions 112. The film 5 is partially projected from the region 110 to the region 112 so as to take out the potential voltage of the region 110. On the projecting portion of the film 5 in the region 112 is mounted a contact 108 for taking out the voltage of the region 110 through the film 5.

FIGS. 5a to 5d illustrate a process for producing the substrate of FIG. 1, representing different steps of the process in sequence, respectively.

(A) First, on a single crystal silicon substrate 2 is formed a silicon oxide film 4 to a thickness of about 1 μm. The substrate 2 may be the one in which transistors or other driving elements are preformed. On the film 4 is deposited a tungsten film 5 as a refractory film of about 800 Å thick by a sputtering method. The film 5 is patterned by a photolithographic process and an etching process. On the patterned film 5 is deposited a polycrystalline silicon film 6 to about 5000 Å thick by a low pressure CVD method. Further, on the film 6 is deposited a silicon nitride ($Si_3N_4$) film 8 to about 800 Å thick by a CVD method. On the film 8 is formed a polyethylene glycol layer 10 as a cooling medium. An optical glass plate 12 is placed on the layer 10 so as to even the thickness of the layer 10.

An argon ion laser beam 13 which is converged by a lens system (not shown) is irradiated upon the film 6 through the glass plate 12, the cooling medium layer 10 and the film 8 so as to melt the film 6. The laser beam 13 is moved relative to the substrate 2 so as to change the molten portion 7 of the film 6. In the area where the molten portion 7 is passed, a single crystal silicon 100a is grown.

The laser beam irradiation condition is such that when a continuous oscillation argon laser is used, the optical power thereof is about several watts (W) to 20 W. For example, a laser beam of 3 W is used in this particular embodiment. The diameter of the laser beam 13 spotted on the film 6 is about 20 to 100 μm. The scanning speed is about several cm/s to 25 cm/s. By irradiating the laser beam under such conditions, the polycrystalline silicon film 6 is molten and recrystallized to grow a single crystal silicon film.

(B) After that, the glass plate 12, the layer 10 and the film 8 are removed.

(C) Phosphorus is implanted into the single crystal silicon film 100a to form a phosphorus implanted film 100b. The implantation amount of phosphorus is about $10^{17}$ to $10^{19}/cm^3$.

(D) On the film 100b is formed a single crystal silicon film 14 of about 5000 Å thick by an epitaxial growth process. In this crystal growing process, the impurities included in the film 100b is diffused into the epitaxial layer to form a diffusion layer 100 having a gradual density grade along the depth of the film 100. Thereby, the film 100 comes in ohmic contact with the tungsten film 5.

Figure 5A:
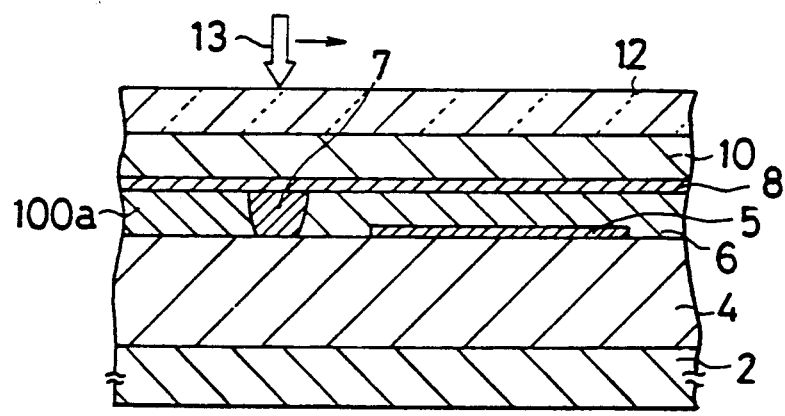
FIGS. 5a to 5d are sectional views of the semiconductor substrate representing a flow chart of a producing process of the substrate in accordance with an embodiment of the present invention illustrating different steps in sequence in this order.
Figure 5B:
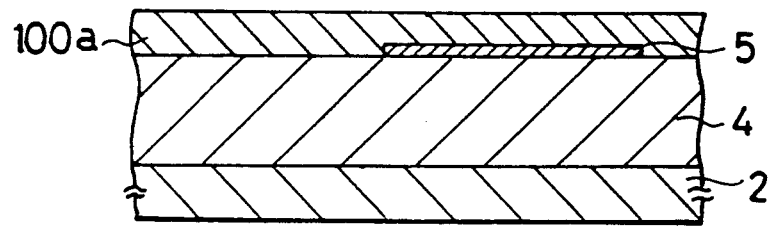
Figure 5C:
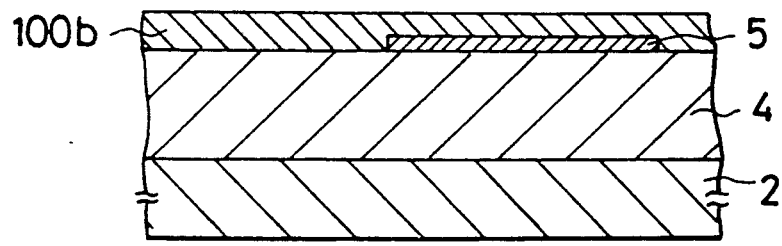
Figure 5D:
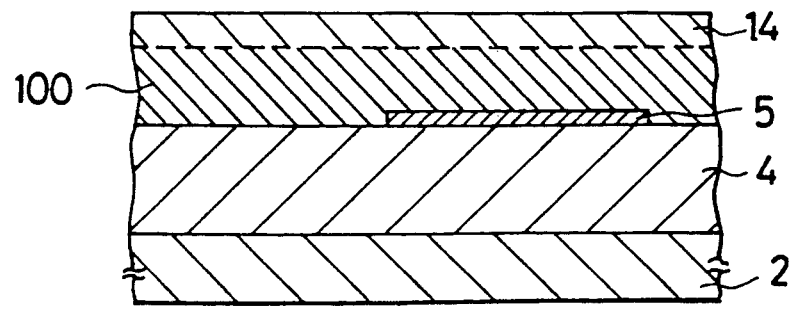
Figure 6A:
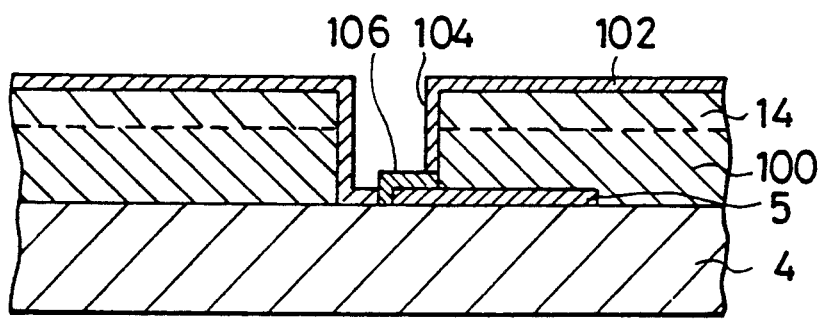
FIGS. 6a and 6b are sectional views of the semiconductor substrate representing different steps of a device isolation process, respectively, using the substrate in accordance with an embodiment of the present invention.
Figure 6B:
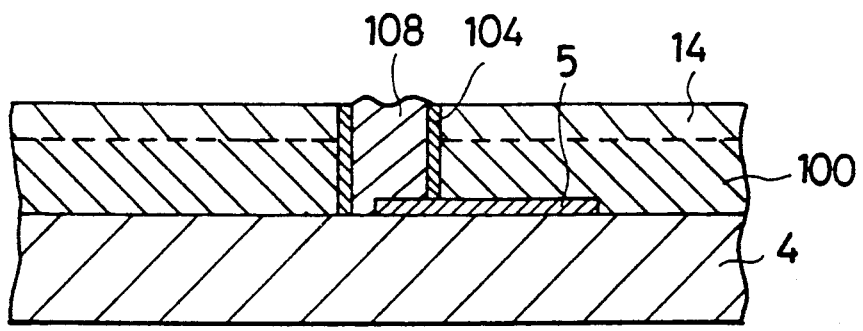
Figure 7A:
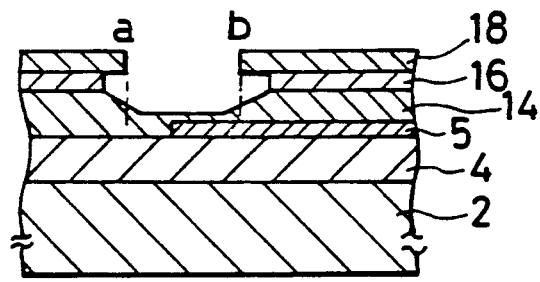
FIGS. 7a to 7d are sectional views of the semiconductor substrate for explaining a device isolation process using the substrate in accordance with an embodiment of the present invention, representing different steps of the process in this order.
Figure 7B:
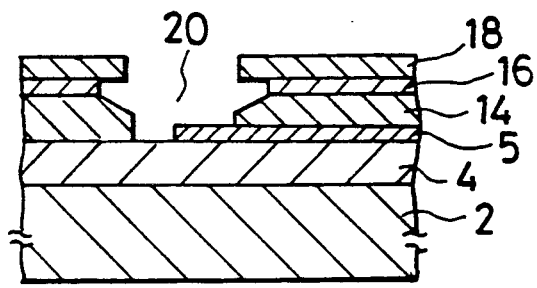
Figure 7C:
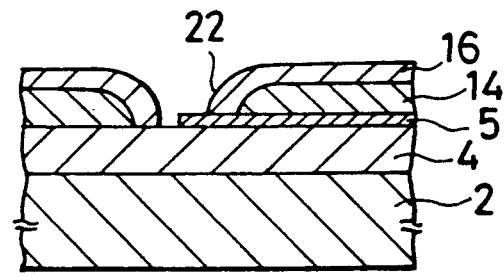
Figure 7D:
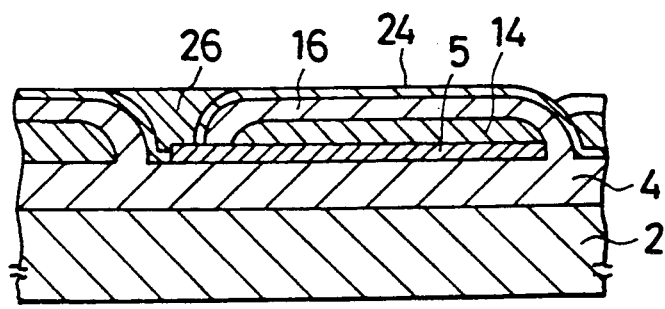

FIGS. 6a and 6b illustrate a process for device element isolation as illustrated in FIGS. 3 and 4 using the substrate produced by the process represented in FIGS. 5a to 5d, mentioned above.

(A) A groove is formed in the single crystal silicon film 14 to expose a part of the tungsten film 5. After that, the surface of the film 14, the inside wall surface of the groove and the exposed surface of the film 5 are oxidized to form oxide films 102, 104 and 106, respectively.

(B) The oxide film 102 formed on the film 14 and the oxide film 106 formed on the film 5 are removed by an anisotropic etching process such as RIE (Reactive Ion Etchig). On the other hand, the oxide film 104 formed on the inside wall of the groove is left remained.

After that, the groove is filled with polycrystalline silicon 108 and impurities are introduced into the silicon layer 108 by deposition or implantation of the impurities to form a conductive type structure.

FIGS. 7a to 7d illustrate another example of the process for device element isolation using the semiconductor substrate of the present invention.

(A) The surface of the single crystal silicon film 14 grown on the film 5 is oxidized by a thermal oxidation process to form a silicon oxide film 16 of about 250 to 500 Å thick. Further, on the film 16 is formed a silicon nitride ($Si_3N_4$) film 18 of about 1000 Å thick by a CVD method.

After that, the film 18 is patterned by a photolithographic process and an etching process to have an opening through which the silicon oxide film 16 is exposed. The film 16 exposed through the pattern opening is etched by a wet etching process. In this process, the film 16 is overetched to the portion under the film 18.

After that, the film 14 is etched with the use of an alkali anisotropic etching solution. This etching proceeds obliquely along the (111) plane of the crystal. The anisotropic etching process is conducted until the etched portion of the (111) plane exceeds inward from the edges a and b of the opening portion of the film 18.

(B) After that, the film 14 is etched using the film 18 as a mask. The etching is conducted until the film 4 is exposed. By this etching process, a groove 20 is formed in the film 14.

(C) A silicon oxide film 22 is formed in the groove 20 by a selective oxidation process using the film 18 as a mask. The thickness of the film 22 is about 0.3 to 1 μm.

After that, the film 18 used as a mask is removed.

(D) A silicon nitride film 24 is formed again over the surface of the layered structure to about 1000 Å thick. This film 24 is arranged so as to avoid oxidation of the inside portion of the film 14 in the oxidation process conducted later as well as to avoid generation of crystal defects in the film 14. However, the film 24 may be deleted if the requirment for film 14 is not so strict.

The film 24 is etched to expose the tungsten film in the groove 20. After that, the groove 20 is filled with polycrystalline silicon 26. In the silicon 26 is diffused phosphorus to reduce the resistance of the silicon 26.

In accordance with the substrate after conducting the device element isolation process, as mentioned above, it becomes possible to equalize the electric potential of the film 14 on the region where the film 5 is disposed with that of the conductor 26, 108 disposed in the groove. For example, when the film 14 is used as a well for producing an MOS transistor, the potential of the well can be taken from the groove in the region of the device element isolation. Also, when a bipolar transistor is formed in the film 14, the potential of the collector can be taken from the groove in the region of the device element isolation.

When the potential is not to be taken from the groove of the element isolation area, the groove is filled with polycrystalline sillicon which is oxidized to form a silicon oxide on the exposed surface thereof. Due to this arrangement, the film 14 is completely isolated from the other portion of the substrate by the film 4 under the film 14 and the groove of the isolation structure so that a completely isolated silicon island can be realized.

The groove may be filled with a dielectric material such as $SiO_2$ or $Si_3N_4$ or a high polymer substance instead of polycrystalline silicon 26, 108.

When a semiconductor device element is formed in the silicon island produced as mentioned above through an MOS process or a bipolar process, it becomes possible to realize a high speed device with low junction capacitance.

In FIG. 5a, in order to further evenly arrange the polyethylene glycol film 10, a silicon oxide film of about 1000 Å thick may be formed on the silicon nitride film 8 by a low pressure CVD process so that the film 10 is formed on the silicon oxide film instead of being directly formed on the film 8. This is because that the wetting characteristic of the polyethylene glycol is better for the silicon oxide film than for the silicon nitride film.

The purpose of the glass plate 12 is to even the thickness of the film 10. However, the glass plate 12 may be deleted.

The substrate structure of FIG. 2 in which the refractory metal film is disposed over the entire area of the substrate can be produced in the same manner as described with reference to FIGS. 5a to 5d.

A process for producing a single crystal GaAs film on a dielectric film is described hereinafter.

First, in a manner similar to that of FIG. 5, a silicon oxide film 4 is formed on a single crystal silicon substrate to about 1 μm thick. On the film 4 is formed a GaAs film to about 5000 Å thick by an evaporation method. After that, a polyethylene glycol layer 10 is formed on the GaAs film as a cooling medium. A glass plate 12 is arranged on the layer 10. In this state, an argon ion laser beam 13 irradiates and scans the GaAs film to melt the film and recrystallize the film to grow a single crystal GaAs film. Impurities are introduced into the single crystal GaAs film and after that, on the film is formed an epitaxial film of GaAs by an epitaxial growth process.

In accordance with the GaAs film producing process mentioned above, it becomes possible to realize a three-layered structure in which a single crystal GaAs film is formed on the single crystal silicon substrate through an insulation film 4. This is advantageously applied to electronic devices in such a way that, for example, a device element is formed in the lowermost substrate by an MOS process or a bipolar process and that an optical device such as a light emitting diode or a laser diode is formed in the uppermost GaAs film whereby it becomes possible to realize an electronic device in which an I/O device and the peripheral circuit are combined as one unit.

Also, it becomes possible to overcome the difficulty to form the GaAs film over a large area on the substrate of a large diameter as it has been in accordance with the prior art.

An electron beam or other energy can be used instead of the laser beam used in the embodiments mentioned above.

In a semiconductor integrated circuit device, for example an MOS transistor, it is necessary to take the potential voltage of the well formed in the semiconductor substrate which is made from for example single crystal silicon. The electrode from which the potential voltage is taken out is usually disposed on the surface of the substrate on which the device element is formed.

Figure 8:
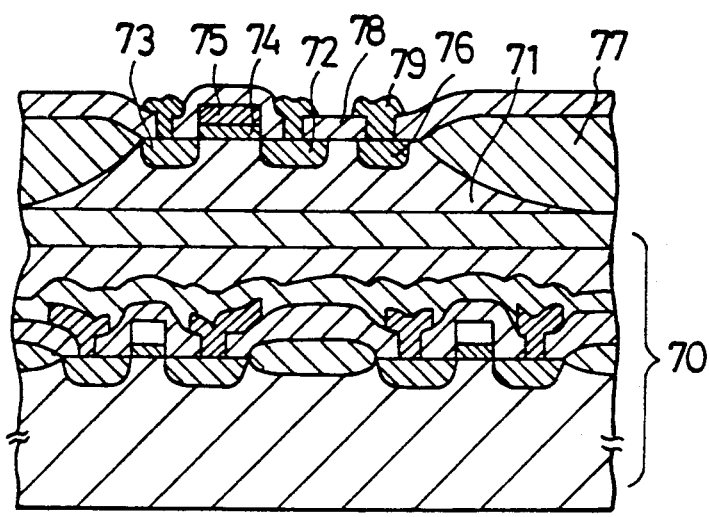
FIG. 8 is a sectional view of a semiconductor device in accordance with an art relating to the present invention.

FIG. 8 illustrates a multi-layered semiconductor device in accordance with an art relating to the present invention.

Numeral 70 designates a base member comprising a silicon substrate which has transistors formed therein and whose surface is smooth and flattened, and an electric insulation film formed on the substrate. On the base member 70 is formed a single crystal silicon film 71 in which a source 72 and a drain 73 made by N+ diffusion area are formed. In a channed region between the source 72 and the drain 73 is formed a gate oxide film 74 on which a gate electrode 75 is formed.

Also, in the film 71 is formed a P+ diffusion area 76 of the same conductive type as the film 71 to take the potential voltage of the film 71. Numeral 77 designates a field oxide film for the isolation of the device element. Numeral 78 designates an electric insulation film disposed between layers to be separated from each other. Numeral 79 designates a circuit wiring pattern made from Al or Al—Si alloy.

In accordance with the semiconductor device mentioned above, it is necessary to arrange the film 78 for element isolation between the diffusion area 76 and the semiconductor element, causing to enlarge the area for taking the potential voltage of the single crystal silicon film, which impedes to raise the integration density of the semiconductor device.

Besides, the device circuit has to be designed considering the diffusion region 76 for taking the potential voltage of the single crystal silicon film, which makes it troublesome to design the device.

In accordance with a complementary MOS (CMOS), an N well is connected to Vcc (5 V) and a P well or a P substrate is connected to Vss (0 V). Also, in accordance with a semiconductor integrated circuit having a logic circuit and a memory circuit mounted together therein, the characteristic of either the logic circuit or the memory circuit is necessarily impaired to a certain extent.

Considering the above mentioned points, embodiments of the present invention described below are made in which the integration density of the device is raised and the circuit structure is simplified as well as that the freedom of the device for the potential voltage of the well or the substrate is hightened. Such embodiments are illustrated in FIGS. 9 to 11.

Figure 9:
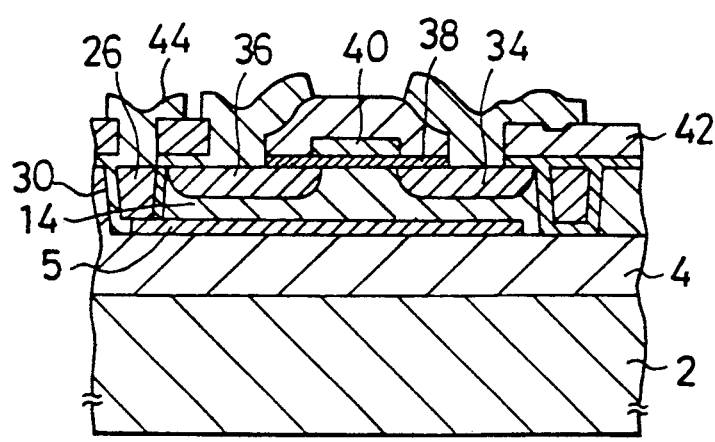
FIG. 9 is a sectional view of an example of a semiconductor device in which a substrate in accordance with the present invention is used.
Figure 10:
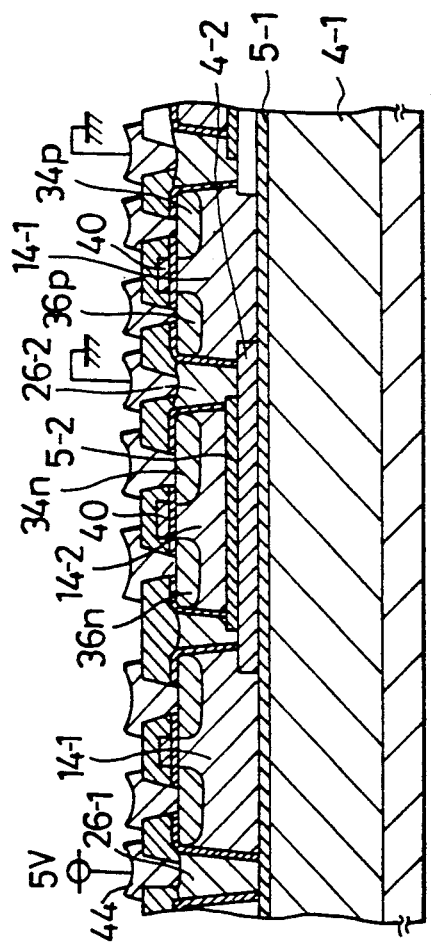
FIG. 10 is a sectional view of another example of a semiconductor device in which a substrate in accordance with the present invention is used.
Figure 11:
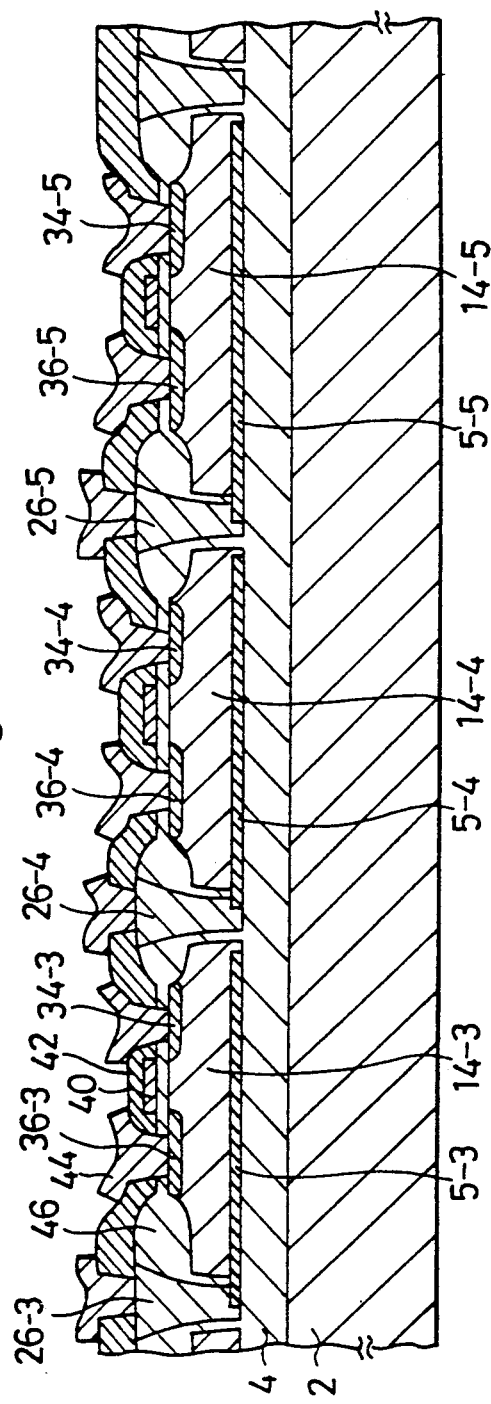
FIG. 11 is a sectional view of still another example of a semiconductor device in which a substrate in accordance with the present invention is used.

FIGS. 9 to 11 illustrate embodiments of the present invention, each comprising an electric insulating base member and a single crystal silicon film formed on the base member through a refractory metal film or a refractory alloy film wherein the silicon film is isolated by grooves having a dielectric film formed on the side wall thereof to constitute a well in which a semiconductor element is formed wherein the refractory metal or the refractory alloy of the well extends to the inside of the groove so that the potential voltage of the well is taken through a conductor disposed in the groove.

The base member comprises, for example, a single crystal silicon substrate on which a dielectric film made from material such as SiO$_2$ or Si$_3$N$_4$ is formed. Or otherwise, the base member may be made from a dielectric plate. The refracrory metal is, for example, W, Ti, Mo or Pt. The refractory alloy is, for example, silicide of those refractory metals.

The conductor to be buried in the groove is composed of a material which is able to come in ohmic contact with the refractory metal or the refractory alloy such as a low resistant metal or polycrystalline or amorphous silicon which resistance is lowered by implanting impurities thereinto.

The refractory matal or the refractory alloy disposed under the well portion where the semiconductor device element is formed functions as a low resistant buried layer. The buried layer extends into the groove for the element isolation wherein the layer is connected to the conductor arranged in the groove. Therefore, it becomes possible to take the potential voltage of the well from the groove. It is not necessary to arrange a special diffusion layer for taking the potential voltage of the well as it was in the prior art.

In FIG. 9, numeral 2 designates a single crystal silicon substrate on which surface is formed a silicon oxide film 4 of about 5000 to 6000 Å thick. On the film 4 is formed a tungsten film 5 of about 800 to 1000 Å thick. The film 5 is patterned. A single crystal silicon film 14 of about 5000 to 10000 Å thick is formed on the film 4 through the film 5. The film 14 has an impurities-diffusion layer in the lower side thereof as the structure of FIG. 1. The diffusion layer has a density grade which gradually decreases upward.

The film 14 is isolated by grooves to form a device element surrounded by the grooves. The side wall of the groove is coated with a dielectric film 30 such as silicon oxide film or silicon nitride film. A conductor 26 is buried in the groove. The conductor 26 is made from, for example, polycrystalline silicon the resistance of which is lowered by introducing impurities thereinto. The film 5 extends and projects from the isolated element portion to the inside of the groove and comes in contact with the conductor 26 in the groove.

In the film 14 which is isolated by the grooves, a source 34 and a drain 36 are formed by diffusing impurities into the film. When the film 14 is of P-type, the source 34 and the drain 36 are of N+ type, while when the film 14 is of N-type, the source 34 and the drain 36 are of P+ type. On the channel region is formed a gate electrode 40 through a gate oxide film 38. Numeral 42 designates an electric insulation film disposed between layers to be separated. Numeral 44 designates a circuit wiring metal made from Al or Al—Si. The wiring metal 44 is connected to the conductor 26 in the groove.

A process for producing the structure of FIG. 9 is described hereinafter.

The film 14 is formed in the same way as that of FIG. 5.

Grooves are formed in the film 14 to define an isolation region in the film 14 by an RIE etching process. A dielectric film 30 made from a material such as silicon oxide or silicon nitride is formed to cover the inside wall of the groove and the film 14. The dielectric film deposited on the region where the device element is to be formed is removed by, for example, an IRE etching process. Also, in this etching process, the dielectric film deposited on the film 5 is simultaneously etched away.

After that, the groove is filled with polycrystalline silicon including impurities. Or otherwise, the groove may be filled with polycrystalline silicon not including impurities and after that impurities are diffused or implanted into the polycrystalline silicon disposed in the groove. By this arrangement, the film 5 and the low resistant polycrystalline silicon (conductor) 26 are electrically connected together in the groove.

After that, a semiconductor element is fabricated in the film 14 in accordance with an LSI process. A contact member is formed on the conductor 26 buried in the groove so that the potential voltage of the film 14 constituting the device element can be taken from the contact.

In FIG. 10, a first refractory metal film 5-1 made from tungsten is formed on a silicon oxide film 4-1. On the film 5-1 is formed a silicon oxide film 4-2 which is patterned. On the film 4-2 is further formed a second refractory metal film 5-2 made from tungsten. The film 5-2 is patterned.

Numerals 14-1 and 14-2 designate single crystal silicon films, respectively, which are separated from each other by the grooves for device element isolation. Impurities are introduced into the film regions 14-1 and 14-2 so that the film region 14-1 becomes an N-type region and the film region 14-2 becomes a P-type region.

In the film region 14-1 are formed a source 34p and a drain 36p constituted from P+type diffusion areas, respectively. While in the film region 14-2 are formed a source 34n and a drain 36n constituted from N+type diffusion areas, respectively.

In the channel region of the film 14-1 is formed a gate electrode 40 to constitute a P-channel MOS transistor formed in the film region 14-1. Also, in the channel region of the film 14-2 is formed a gate electrode 40 to constitute an N-channel MOS transistor in the film region 14-2.

The film region 14-1 is connected to a power source of, for example, 5 V through the film 5-1 and the conductor 26-1 made from polycrystalline silicon doped with impurities and buried in the groove for element isolation.

On the other hand, the film region 14-2 is connected to the ground through the film 5-2 and the conductor 26-2 made from polycrystalline silicon doped with impurities and buried in the groove for element isolation.

In accordance with the structure of FIG. 10, the double-layered refractory metal or alloy structure composed of films 5-1 and 5-2 is disposed under the film regions 14-1 and 14-2, which makes it possible to simultaneously take the potential voltage of a plurality of wells 14-1 and 14-2 in the same potential to the outside.

In FIG. 11, a silicon oxide film 4 is formed on a single crystal silicon substrate 2. On the film 4 is deposited a tungsten film which is patterned to form refractory metal films designated by 5-3, 5-4 and 5-5, respectively. On the films 5-3, 5-4 and 5-5 is formed a single crystal silicon film which is separated to respective element forming regions 14-3, 14-4 and 14-5 by a separation process of LOCOS (Local Oxidation of Silicon; trade name of Phillips Co.) and a separation process by grooving. Numeral 46 designates a field oxide film to be used for the LOCOS separation process. Numerels 26-3, 26-4 and 26-5 designate conductor members made from polycrystalline silicon, each being buried in the groove and doped with impurities to reduce the resistance thereof. The polycrystalline silicon conductors are connected to the films 5-3, 5-4 and 5-5, respectively, in the respective groove.

In each of the isolated regions 14-3, 14-4 and 14-5 is formed a desired device element by an MOS process. Numerals 34-3, 34-4 and 34-5 designate a source, respectively. Numerels 36-3, 36-4 and 36-5 designate a drain, respectively. Numeral 40 designates a gate electrode. Numeral 42 designates an electric insulating film deposed between layers to be separated. Numeral 44 designates a circuit wiring metal.

The potential voltage of each isolated element region 14-3, 14-4, 14-5 can be taken from each film 5-3, 5-4, 5-5 through each conductor member 26-3, 26-4, 26-5. Therefore, when three different kind of transistors are formed, it becomes possible to set different potential voltages for the respective transistors. For example, when three different transistors such as a memory transistor, an N-channel transistor and a P-channel transistor are formed in the isolated element regions, respectively, it becomes possible to set a most optimal potential voltage of the base plate with respect to each transistor independently from the other transistors, which results in that the flexibility of the circuit design is increased and makes the transistors function at their best conditions, respectively.

In the structure of FIG. 11, the element regions are isolated by the LOCOS method and the groove method. However, the element regions may be isolated only by the groove method, as the structures of FIGS. 9 and 10.

Also, in the above mentioned embodiments, the substrate 2 is made from a single crystal silicon substrate. However, it is possible to use as the substrate 2 a dielectric plate such as a ceramic plate which surface is coated with a dielectric film such as a silicon oxide film by a CVD method.

As mentioned above, in accordance with the structures illustrated in FIGS. 9 to 11, it becomes possible to use the groove for device element isolation as a means for taking the potential voltage of the isolated well region, which makes it unnecessary to provide a diffusion region specially for taking the potential voltage of the well, resulting in that a semiconductor device of compact and high density structure can be realized.

Also, the circuit pattern is simplified, which makes the design of the device easier.

Figure 12:
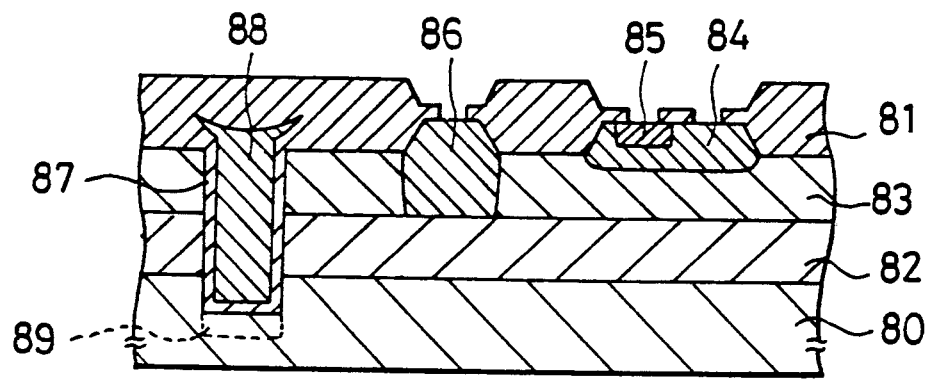
FIG. 12 is a sectional view of a semiconductor device of the OST structure in accordance with an art relating to the present invention.

FIG. 12 illustrates a semiconductor device having an OST structure.

In the drawing is represented a silicon substrate 80, a field oxide film 81, an N+type buried layer 82, an N+type epitaxial layer 83, a base 84, an emitter 85 and a collector contact 86.

In order to reduce the junction capacitance and the parasitic capacitance of the isolating portion between transistors, a groove that penetrated through the layer 82 is formed in the isolating portion. The inner surface of the groove is covered with a silicon oxide film 87. Also, the groove is filled with polycrystalline silicon 88. Numeral 89 designates a P+type channel cut.

However, in the structure of FIG. 12, mentioned above, there is still relatively large amount of junction capacitance between the substrate 80 and the layer 82 since the layer 82 is formed by an N+type diffusion region.

Figure 13:
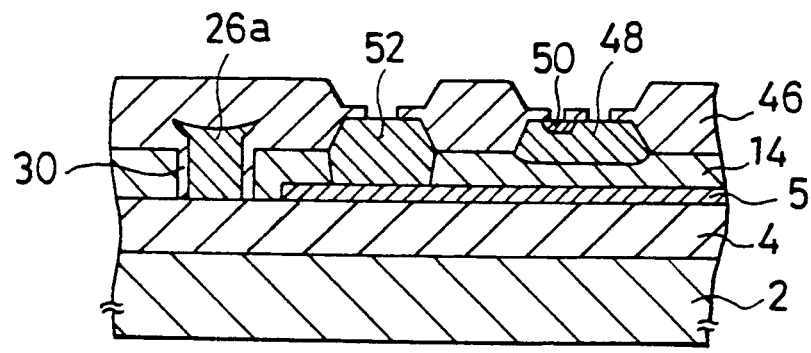
FIG. 13 is a sectional view of a still further example of the semiconductor device in which a substrate in accordance with the present invention is used.
Figure 14:
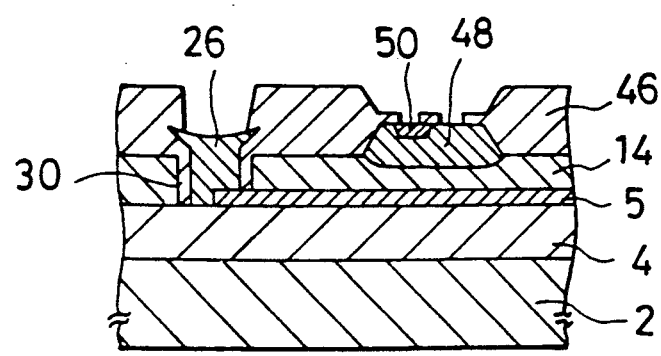
FIG. 14 is a sectional view of a still further example of the semiconductor device in which a substrate in accordance with the present invention is used.
Figure 15A:
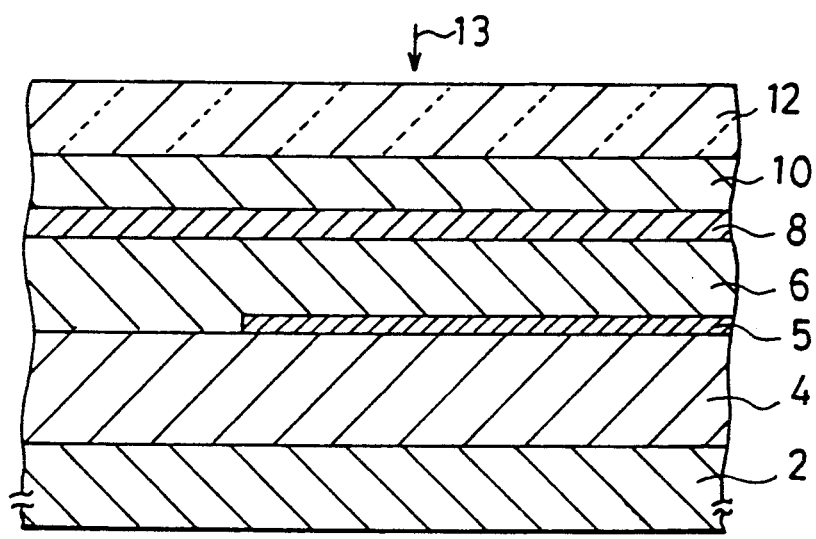
FIGS. 15a to 15e are sectional views of the semiconductor device of FIG. 13, representing different steps of a process for producing the device, respectively, in sequence in this order.
Figure 15B:
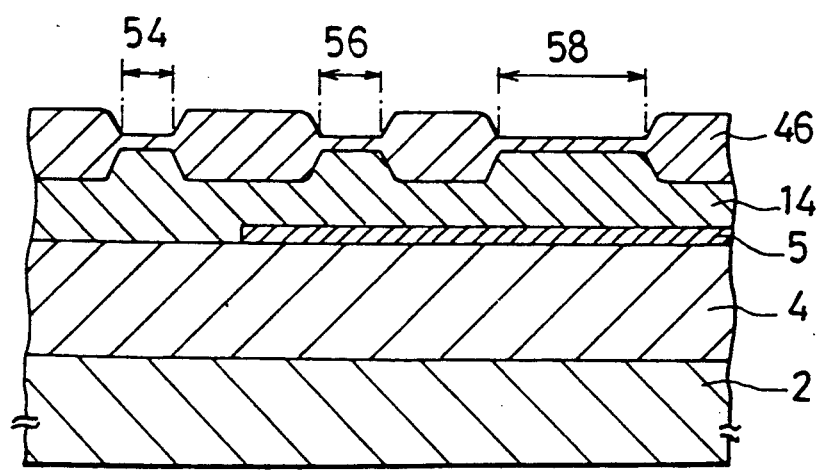
Figure 15C:
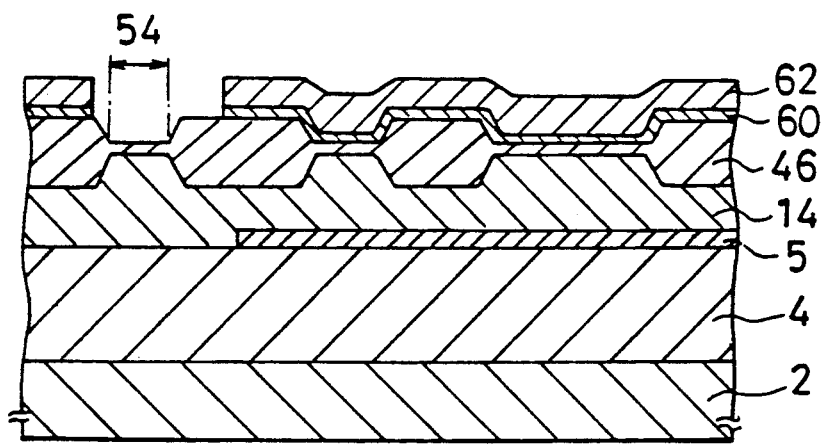
Figure 15D:
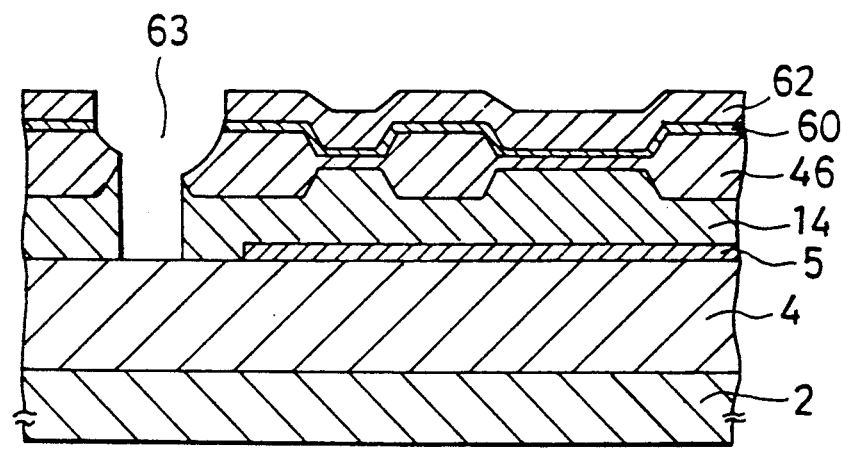
Figure 15E:
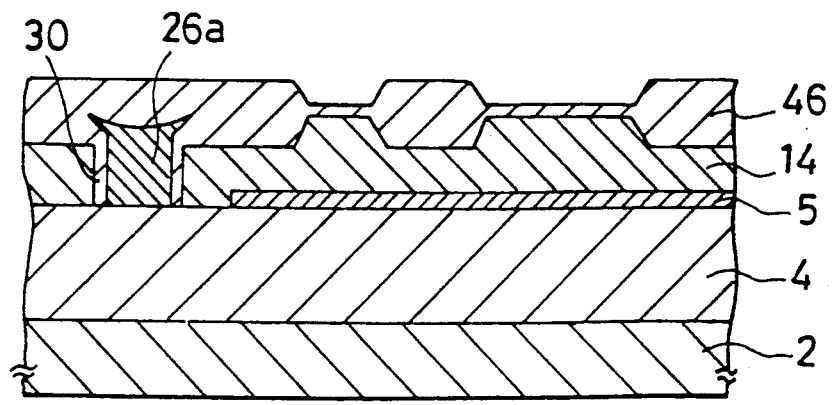

FIGS. 13 and 14 illustrate embodiments of the present invention applied to a semiconductor device in which the junction capacitance and the parasitic capacitance are further reduced so that the switching speed is heightened by using a refractory metal film (including alloy such as refractory metal silicide film) as the layer 82. It is to be noted that in the drawings of FIGS. 13 and 14, the electric insulation layer disposed between layers to be separated, the circuit wiring metal and the passivating film are deleted.

In FIG. 13, on a silicon substrate 2 is formed a silicon oxide film 4 of about 1 μm thick. On the film 4 is formed a refractory metal film 5 made from tungsten of about 800 to 1000 Å thick. The film 5 is patterned. A single crystal silicon film 14 is formed on the film 5 to about 1000 Å thick. In the film 14 is formed a transistor comprising a base 48, an emitter 50 and a collector contact 52 using the film 14 as a collector. The film 14 has a diffusion layer doped with impurities in the lower side thereof. The density of the diffusion layer is gradually decreased upward along the depth of the film as the film 14 of FIG. 1.

In the isolating portion is formed a groove that reaches to the film 4. The inside surface of the groove is covered by a silicon oxide film 30. The groove is filled with a polycrystalline silicon 26a which is not doped with impurities.

The collector contact 52 is being in contact with the film 5.

In the structure of FIG. 14, the collector contact 52 of FIG. 13 is deleted. In FIG. 14, the film 5 is projected and exposed in the groove for device element isolation. The groove of the isolating portion is filled with polycrystalline silicon 26 that is doped with impurities to reduce the resistance thereof. A contact hole is formed on the polycrystalline silicon 26. The film 5 comes in contact with the low resistant (conductive) polycrystalline silicon 26 in the groove so that it becomes possible to contact with the collector in the groove through the film 5 and the polycrystalline silicon 26.

In accordance with the structure of FIG. 14, the necessary area for one transistor is decreased so that it becomes possible to realize a compact and high density semiconductor device.

FIGS. 15a to 15e illustrate a process for producing the semiconductor device of FIG. 13 representing different steps of the process in sequence, respectively. The process is described hereinafter with reference to the drawings.

(A) A single crystal silicon film is formed on the dielectric film 4 according to the same process as explained with reference to FIG. 5a.

(B) After that, the isolating portion 54, the collector contact portion 56 and the base portion 58 are covered with a mask made from a silicon nitride film. In this state, a field oxide film 46 of about 1 to 1.5 μm thick is formed by a selective oxidization process.

(C) After that, a silicon nitride film 60 is formed all over the structure surface to about 0.1 to 0.2 μm thick by a CVD process. Next, a PSG (Phospho-Silicate Glass) 62 is formed on the film 60 to about 0.5 μm thick.

An opening is formed at the isolating portion 54 by removing the films 60 and 62 by a photolithographic process and an etching process.

(D) After that, a groove 63 that reaches to the film 4 is formed at the isolating portion 54 by an etching process of RIE through the opening formed in the preceding step using a mixed gas of ($CCl_4 + BCl_3$).

After that, the film 62 is removed by a wet etching process.

(E) The surface of the groove 63 is selectively oxidized to form a silicon oxide film 30. The groove 63 is filled with polycrystalline silicon 26a which is grown therein and not doped with impurities. The groove 63 may be filled with an insulating material such as $SiO_2$ or $Si_3N_4$ or a high polymer substance instead of polycrystalline silicon.

The surface of the polycrystalline silicon 26a is selectively oxidized by using the silicon nitride film 60 to cover the surface by silicon oxide film. The silicon oxide film formed on the surface comes in contact with the film 46. After that, the film 60 is removed.

After that, the base, the emitter and the collector contact are formed in accordance with the bipolar process.

When the semiconductor device of FIG. 14 is to be produced, the film 5 is patterned to extend to the isolating portion 54 without providing the collector contact portion 56. Also, the polycrystalline silicon 26 which fills the groove formed along the isolating portion is doped with impurities such as phosphorus diffused therein to reduce the resistance thereof. A contact hole is formed on the low resistant polycrystalline silicon 26 to connect with the collector contact portion of the transistor.

In accordance with the semiconductor device having the OST structure illustrated in FIG. 13 or 14, since the isolating portion is constituted by the groove structure that is insulated and the refractory metal is used as the buried layer disposed under the transistor portion, it becomes possible to further reduce the junction capacitance and the parasitic capacitance so that the switching speed of the device is heightened.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor substrate comprising:
a base plate member made from a dielectric material;
a refractory metal film that covers at least a part of said base plate member;
a single crystal semiconductor film formed on said refractory metal film; and
an impurities diffusion layer formed in said single crystal semiconductor film in a side contacting with said refractory metal film and having a density of impurities gradually decreasing in a direction away from said refractory metal film, so that this impurities diffusion layer comes in ohmic contact with said refractory metal film.

2. A semiconductor substrate according to claim 1, wherein device element portions where semiconductor device elements are to be formed are isolated from each other by grooves, wherein said refractory metal film is disposed in at least one of said device element portions and wherein a part of said refractory metal film extends and projects into at least one of said groove, so that an inside of said device element portion can be electrically connected to outside through said refractory metal film projecting to said at least one groove.

3. A semiconductor substrate according to claim 2, wherein a transistor is formed as said device element in said at least one device element portion.

4. A semiconductor substrate according to claim 2, wherein said refractory metal film is constituted as a double layered structure interposing a dielectric film between two refractory metal films, and wherein the two refractory metal films of said double layered structure extend into different grooves.

5. A semiconductor substrate according to claim 4, wherein the lower one of said two refractory metal films of said double layered structure extends to at least two of said device element portions, so that the insides of at least two device element portions are electrically connected to each other.

6. A semiconductor substrate according to claim 1, wherein said base plate member comprises a single crystal silicon substrate and a silicon oxide film formed on said single crystal silicon substrate.

7. A semiconductor substrate according to claim 1, wherein said single crystal semiconductor film comprises a film recrystallized from polycrystalline or amorphous semiconductor.

* * * * *